United States Patent [19]

Minami et al.

[11] Patent Number: 5,672,549
[45] Date of Patent: Sep. 30, 1997

[54] METHOD OF PRODUCING EPOXY RESIN-ENCAPSULATED SEMICONDUCTOR DEVICE

[75] Inventors: Katsunori Minami, Tsu; Hideo Ito, Utsunomiya, both of Japan

[73] Assignee: Sumitomo Bakelite Company Limited, Tokyo, Japan

[21] Appl. No.: 681,348

[22] Filed: Jul. 22, 1996

[30] Foreign Application Priority Data

Jan. 31, 1996 [JP] Japan .................. 8-015247
Jan. 31, 1996 [JP] Japan .................. 8-015248

[51] Int. Cl.⁶ ............................................. H01L 21/60
[52] U.S. Cl. .................... 437/211; 437/209; 437/212
[58] Field of Search ........................ 437/209, 211, 437/212, 214, 215, 216, 217, 218, 219, 220

[56] References Cited

U.S. PATENT DOCUMENTS

| | | | |
|---|---|---|---|
| 5,091,341 | 2/1992 | Asada et al. | 437/212 |
| 5,179,039 | 1/1993 | Ishida et al. | 437/212 |
| 5,367,766 | 11/1994 | Burns et al. | 437/219 |
| 5,427,938 | 6/1995 | Matsumura et al. | 437/211 |
| 5,474,958 | 12/1995 | Djennas et al. | 437/211 |
| 5,525,547 | 6/1996 | Matsunaga et al. | 437/217 |

*Primary Examiner*—Kevin Picardat
*Attorney, Agent, or Firm*—Browdy and Neimark

[57] ABSTRACT

In a method of producing a resin-encapsulated semiconductor device, a lead frame having an semiconductor element bonded thereto and wire-bonded thereto is set as an insert into an injection mold. An epoxy resin molding compound is injected into the mold by an injection molding. In this method, an injection pressure of the injection molding machine is gradually increased in such a manner that a maximum pressure of 30 kg/cm² to 300 kg/cm² is achieved at the time when 80% to 95% of a total amount of the epoxy resin molding compound to be injected is injected into the mold. Subsequently, the remaining epoxy resin molding compound is injected into the mold at an injection pressure of 20 kg/cm² to 100 kg/cm². A heating cylinder of the injection molding machine is divided into a plurality of zones which are controlled in the temperature independently. The zone nearest to a nozzle of the heating cylinder is controlled to 65° C.–110° C. while that zone nearest to a hopper of the heating cylinder is controlled to the ordinary temperature to 50° C.

16 Claims, 6 Drawing Sheets

METHOD OF PRODUCING EPOXY RESIN-ENCAPSULATED SEMICONDUCTOR DEVICE

BACKGROUND OF THE INVENTION

1. Field of the Invention

This invention relates to a method of producing a resin-encapsulated semiconductor device. More particularly, it relates to a method of producing a resin-encapsulated semiconductor device by injecting an epoxy resin compound into an injection mold, in which a lead frame, to which a semiconductor has been bonded and wire-bonded, is fixedly set as an insert in an injection mold, and by curing such epoxy resin compound in the injection mold.

2. Description of the Related Art

In the encapsulation of semiconductor devices such as an IC and a LSI, a transfer molding method, using an epoxy resin molding compound, has heretofore been used because of the low cost, high reliability and efficient productivity thereof. Generally, in the transfer molding, the epoxy resin molding compound is formed into a tablet-like shape, and then this tablet is charged into a pot in a mold, and the tablet, while melted by heat in the mold, is pressurized by a plunger, so that the molten molding compound is caused to flow, and then is cured.

With this molding method, however, it is necessary to first shape the epoxy resin molding compound into the required configuration (that is, tablet-like shape), and therefore the shaping step is needed. Depending on the shape and size of semiconductor devices, the shape of the tablets varies widely, and therefore there are required many mold devices for shaping the epoxy resin molding compound. Since the charging of the tablet and the melting of the tablet by heat are required for each molding operation, the time period of the molding cycle can not be reduced to less than a predetermined time period, and this limits the reduction of the cost and the mass productivity. Further, there is a possibility that impurities are intruded into the molding compound in the preprocessing steps such as the shaping step. In the transfer molding, residual culls in runners through which the molding compound, charged into the pot, flows to a mold cavity, and in the pot are completely cured, and therefore can not be reused. This results in a problem that a large amount of resin other than the resin used to form the semiconductor packages is wasted.

On the other hand, there has heretofore been made a study of injection molding using a thermosetting resin molding compound, such as an epoxy resin. In the injection molding, an epoxy resin molding compound in the form of powder or granules is supplied into an injection molding machine, and is kept molten in a cylinder, and is injected into a mold by a screw. Therefore, the seep of shaping the epoxy resin molding compound into a tablet is not necessary, and besides the continuous production is possible, and the device for this shaping purposes, as well as the time for this shaping, is omitted. Further, since the molding material in the molten state is injected into the mold, the curing time is shorter as compared with the transfer molding, and therefore this method is suitable for mass production.

However, at present, the injection molding for encapsulating with epoxy resin molding compound has not yet been put into practical. The reason for this is that in the molten state of the conventional epoxy resin molding compound in the cylinder heated to 70° C.–110° C., the viscosity of this molding compound increases as the curing reaction of the resin in the molding compound proceeds. As a result, its fluidity is lost in 5 minutes–10 minutes, and the thermal stability of the molten molding compound is extremely low. Therefore, it is impossible to effect the injection molding at a low pressure, and then a high pressure injection is required. As a result, the binding wires on the semiconductor device may be deformed or cut off, so that the reliability of the produced semiconductor package is greatly degraded.

There has been pointed out another problem that when interrupting the molding operation for a predetermined time period, for example, for cleaning the mold, the epoxy resin molding compound is cured in the cylinder, and then can not be injected thereafter, so that the continuous production is adversely affected.

SUMMARY OF THE INVENTION

It is an object of this invention to provide a method of producing a semiconductor device encapsulated by injection molding using an epoxy resin compound, by which a long-time continuous molding and mass production can be effected efficiently.

To this end, according to one aspect of the present invention, there is provided a method of producing a resin-encapsulated semiconductor device by injecting an epoxy resin molding compound into an injection mold, in which a lead frame, to which a semiconductor has been bonded and wire-bonded, is fixedly set as an insert in the injection mold, and by curing such epoxy resin molding compound in the injection mold, the method comprising the steps of:

injecting epoxy resin molding compound into the injection mold;

gradually increasing an injection pressure of said injection molding machine in such a manner that a maximum pressure of 30 $kg/cm^2$ to 300 $kg/cm^2$ is achieved at the time when 80% to 95% of a total amount of the epoxy resin molding compound to be injected is injected into the injection mold; and injecting the remaining epoxy resin molding compound at an injection pressure of 20 $kg/cm^2$ to 100 $kg/cm^2$.

According to another aspect of the invention, there is provided a method for producing a resin-encapsulated semiconductor device by means of injecting an epoxy resin molding compound into an injection mold in which a lead frame having a semiconductor element bonded thereto and wire-bonded thereto is fixedly set as an insert by an injection molding machine for injecting an epoxy resin molding compound into the injection mold, the injection molding machine including a cylinder provided at one end thereof with a hopper through which the epoxy resin is supplied into the injection molding machine and at the other end thereof with a nozzle, which cylinder is axially divided into a plurality of sections, wherein each of which sections is to be controlled independently in temperature thereof, and one of the sections most close to said nozzle is maintained at 65° C.–110° C. and one of the sections most close to the hopper is maintained at a room temperature –50° C.

The epoxy resin molding compound used in the present invention usually contains, as essential components, an epoxy resin, a curing agent, a curing accelerator and an inorganic filler. It is in the form of powder or granules. It is not needed to be shaped into a tablet as in the transfer molding. The epoxy resin molding compound is preferably required to exhibit a good thermal stability in a cylinder of an injection molding machine and an excellent fluidity in a cavity, and be cured rapidly. In view of these, the epoxy resin should be one having a low melt viscosity, such as a novolak-type epoxy resin and a biphenolic resin, and particularly having a softening point of 50° C.–80° C. As the curing agent, a phenolic resin, such as a novolak-type phenolic resin, a paraxylylene modified phenolic resin and dicyclopentadiene modified phenolic resin, is used, and particularly a phenolic resin, having a softening point of 60° C.–120° C. and containing a low monocaryon content and a low dicaryon content, is preferred. As the curing accelerator, for example, diazabicycloundecenes (DBU) or organic phosphine, such as a triphenylphosphine, is used, and preferably the curing accelerator is one of high latency exhibiting low activity at low temperature.

In the present invention, a sprueless mold or a sprue-runnerless mold can be used. More specifically, the temperature of the sprue portion of the mold or the temperature of the sprue portion and the runner portion is controlled to a temperature at which the molding compound is hardly cured, that is, a temperature generally equal to the temperature within the cylinder, and by doing so, at the next cycle after the molded product (i.e., the resin-encapsulated semiconductor device) is removed or taken out, the uncured molding compound, residing in the sprue portion or the sprue-runner portion, can be filled in the cavity, thereby effecting the molding. Accordingly, any cured molding compound other than the molded product is hardly formed, and therefore there is achieved an advantage that the amount of resin waste is greatly reduced.

In the encapsulation by the ordinary transfer molding, the ratio of the cured resin waste in the cull-runner portion to the total molding compound is 40%–60%, but in the encapsulation by the injection molding of the present invention, the ratio of the cured resin waste is slightly reduced to 30%–50%, and in the sprueless molding, this ratio is much reduced to 25%–35%, and in the sprue-runnerless molding, this ratio is much reduced to 10%–30%.

The above objects, construction and effects of the present invention will become manifest from the following description.

DESCRIPTION OF THE PREFERRED EMBODIMENTS

Figure 1:
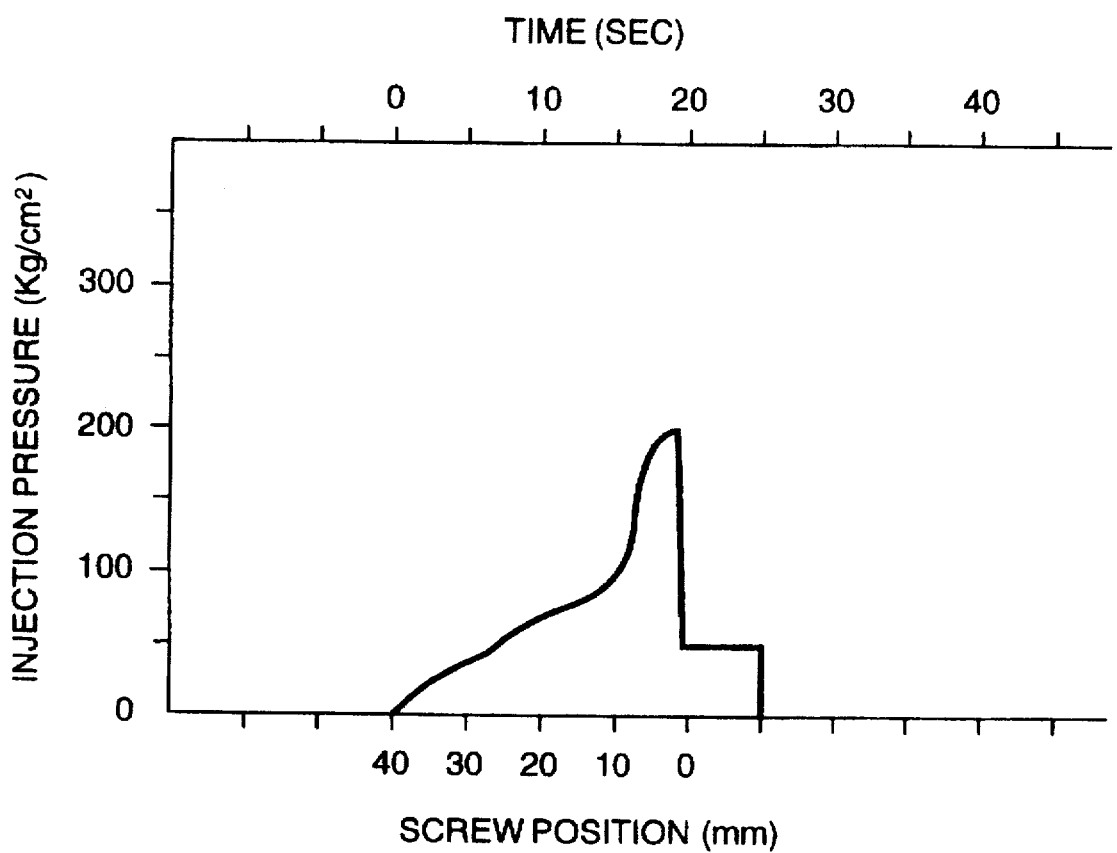
FIG. 1 is a graph showing the relation between an injection pressure of an injection molding machine and an injection time and the relation between the injection pressure and the position of an injection screw.

An injection molding machine used in the present invention is not limited to a particular type, and any suitable injection molding machine, such as a screw inline type, a plunger type and a screw plunger type, can be used; however, in view of easy control and uniform melting, the screw inline type is most preferred.

One embodiment of the present invention is characterized in that an injection pressure of the injection molding machine is increased to a maximum pressure which is between 30 kg/cm$^2$ and 300 kg/cm$^2$ when 80%–95% of a total injection amount of an epoxy resin molding compound has been injected into the mold. The remaining molding compound is injected at an injection pressure of 20 kg/cm$^2$ to 100 kg/cm$^2$. In this case, the ratio of the latter pressure to the former maximum pressure is preferably ¼ to ½. If the above two pressures are higher than the above-mentioned values, respectively, there is a possibility that bonding wires on a semiconductor device may be deformed or cut off. In contrast, if the above two pressures are lower than the above-mentioned values, respectively, there is a possibility that the molding compound may not be properly filled in a mold cavity. Preferably, the maximum injection pressure is in the range of 100 kg/cm$^2$–250 kg/cm$^2$, and the latter pressure is in the range of 40 kg/cm$^2$–120 kg/cm$^2$. These injection pressures are lower as compared with ordinary injection molding of a thermosetting resin. Since the injection pressure is low and the temperature control can be effected easily, a long-time, continuous operation can be effected at a low pressure. Accordingly the molding is effected at the low pressure, the degree of deformation of the bonding wires is low. Therefore a lead frame, having the semiconductor mounted thereon, can be formed into a finer pattern.

The lead frame, having the semiconductor bonded thereto, is fixedly set as an insert in the mold, and then the mold is closed or clamped. The molding compound is injected into the mold. The molding compound is filled at a generally constant rate from the start of the filling to the time when the maximum injection pressure is achieved. If the filling of the molding compound is so continued that the maximum pressure is achieved at the time when the filling is effected 100%, the pressure acts directly on the molded portion at a final stage of the filling operation even if the value of the maximum pressure is small, the deformation or cutting-off of the bonding wires occurs. Therefore, according to the present invention, the injection pressure is reduced slightly before the filling is completed, and thereafter the filling is continued at the lower pressure. Accordingly, the deformation or cutting-off of the bonding wires can be prevented.

The set temperature of a cylinder is usually 65° C., to 110° C., and the temperature control thereof is easy in this range. However, in view of a melt viscosity and a thermal stability, it is preferred that this set temperature is between 70° C. to 90° C. If the cylinder temperature is low, the thermal stability is good although the melt viscosity is high. In the epoxy resin molding compound in the present invention, particularly when the above preferred composition is used, the melt viscosity is low, and therefore the cylinder temperature can be set to a considerably low level. However, if the cylinder temperature is set to less than 65° C., the temperature control of the molding compound becomes difficult. In contrast, if the cylinder temperature is higher than 110° C., the melt viscosity is too low, so that it is sometimes difficult to effect the proper injection, and besides the satisfactory thermal stability is often not achieved.

In this embodiment of the invention, in view of the curing time of the molding compound and so on, the set temperature of the mold is 150° C. to 190° C., and preferably 165° C. to 185° C. With this set temperature, the molding cycle can be not more than 150 seconds, and in the case of the molding compound of the preferred composition, the molding cycle can be not more than 80 seconds.

EXAMPLE 1

An epoxy resin molding compound, used here, comprises, as main components, an orthocresol novolak-type epoxy resin (epoxy resin equivalent weight 200), phenolic novolak (hydroxyl group equivalent weight 103), diazabicycloundecenes (curing accelerator), and molten silica, and further a mold release agent, a pigment and so on.

An injection molding machine of the screw inline type (manufactured by Meiki Seisakusho and sold under the tradename of M-32) is used in this Example. A zone of a heating cylinder, most close to a nozzle, a length of which is 30% of the overall length of the cylinder, is maintained at 75° C., and the other zone of the cylinder is maintained at 30° C. With respect to an injection pressure, the maximum pressure is 200 kg/cm$^2$. The injection pressure is raised upto the maximum pressure by 20 seconds from the start of the injection. Thereafter it is lowered to 50 kg/cm$^2$ and is maintained for 5 seconds, and then gate cut pins are operated to shut off the gates. The time chart of the injection pressure or the relation between the injection pressure and the screw position is shown in FIG. 1. The time period from the closing of the mold to the opening of the mold is 60 seconds, and the total molding cycle is 80 seconds. The temperature of the mold is set to 175° C.

The mold is a twenty-cavity mold. Two lead frees each having 10 IC elements (16p DIP) disposed sequentially, bonded thereto and wire-bonded thereto by gold wires are automatically set in the mold, and the molding is carried out continuously. The appearance, filling ability, wire sweep, and surface hardness of the resin-encapsulated semiconductor devices are measured every hour. Results are shown in Table 1.

TABLE 1

| | Appearance | Filling ability | Wire sweep | Surface hardness |
|---|---|---|---|---|
| Initial stage | good | good | not more than 5% | 74 |
| 5 hours past | " | " | not more than 5% | 74 |
| 10 hours past | " | " | not more than 5% | 74 |
| 15 hours past | " | " | not more than 5% | 75 |
| 20 hours past | " | " | not more than 5% | 76 |

Measurement (1) Appearance; Filling ability: These are judged with the visual inspection, and particularly the appearance is checked with respect to whether or not it has good luster.

(2) Wire sweep: A soft X-ray is applied to the molded product, and the amount of sweep of the bonding wire (semi-hard gold wire having a diameter of 25 µm and a length 3 mm) is measured. The wire sweep is expressed in the term of a ratio of the maximum wire sweep to the distance (500 µm) between the bonding wires.

(3) Surface hardness: The surface hardness of the molded product immediately after the opening of the mold is measured by a Barcol hardness tester (#935).

These results shown in the table 1 are similar to those obtained with the conventional low-pressure transfer molding, and indicate that there is no problem at all. Therefore, it will be appreciated that the long-time, continuous molding can be effected.

In another embodiment of the invention, a heating cylinder of an injection molding machine is divided into a plurality of zones in an axial direction. The number of the zones is at least two, and this number is not limited to a specified number. However, four or five zones are preferable. The zones are controlled in temperature independently. In order to effect the continuous molding more stable than the conventional molding, the temperature of a zone (hereinafter often referred to as "most nozzle-side zone") nearest to a nozzle is controlled between 65° C. and 110° C., and the temperature of a zone (hereinafter often referred to as most hopper-side zone) nearest to a hopper is controlled between an ordinary temperature and 50° C. The former temperature is preferably 70° C. to 90° C., and the latter temperature is preferably 30° C. to 40° C. In these temperature ranges, the feature that the epoxy resin molding compound has a low melt viscosity is fully achieved, and there is no problem with the thermal stability, and therefore the stable, long-time, continuous molding can be effected.

In the case where the heating cylinder has two zones, the overall length of the most nozzle-side zone is 20% to 40% of the overall length of the cylinder. In the case where the heating cylinder has 3 to 5 zones, the most nozzle-side zone has the same temperature and length as described above for the two-zone cylinder. The temperature of one to three intervenient zones is a temperature intermediate between the temperature of the most nozzle-side zone and the temperature of the most hopper-side zone. The higher the temperature of the intervenient zone becomes, the more the intervenient zone is close to the most nozzle-side zone. The temperature of the most hopper-side zone is the same as described above for the two-zone cylinder. The lengths of those zones other than the most nozzle-side zone are suitably determined in view of the thermal stability and melt viscosity of the epoxy resin molding compound.

If the cylinder temperature is low, the thermal stability is good although the melt viscosity is high. In the epoxy resin molding compound in the present invention, particularly when the above preferred composition is used, the melt viscosity is low, and therefore the cylinder temperature can be set to the considerably low level. However, if the cylinder temperature becomes less than 65° C., the temperature control becomes difficult. In contrast, if the cylinder temperature is higher than 110° C., the melt viscosity is too low, so that it is sometimes difficult to effect the proper injection molding, and besides the satisfactory thermal stability is often not achieved.

In this embodiment of the invention, with respect to the injection pressure of the injection molding machine, the same condition described above is applied, and the same advantages can be obtained.

In this embodiment of the invention, in view of the curing time of the epoxy resin molding compound and so on, the set temperature of the mold is usually 150° C. to 190° C., and preferably 165° C. to 185° C. With this set temperature, the molding cycle can be not more than 170 seconds, and in the case of the molding compound of the preferred composition, the molding cycle can be not more than 100 seconds.

EXAMPLE 2

An epoxy resin molding compound, used here, comprises, as main components, an orthocresol novolak-type epoxy resin (epoxy resin equivalent weight 200), phenolic novolak (hydroxyl group equivalent weight 103), diazabicycloundecenes (curing accelerator), and molten silica, and further a mold release agent, a pigment and so on.

Figure 2:
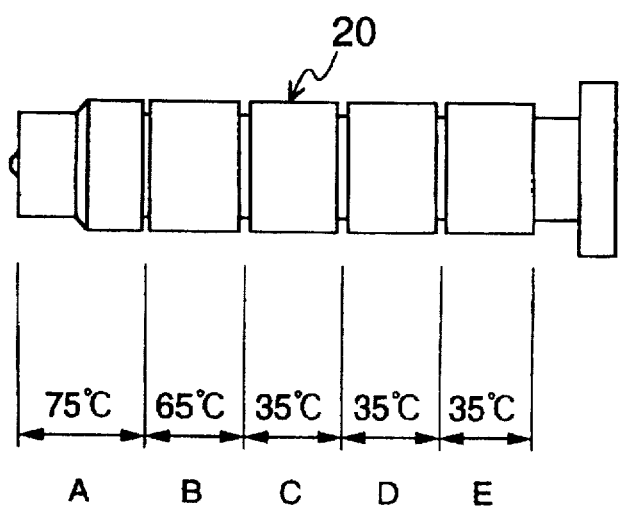
FIG. 2 is a view showing division zones of a heating cylinder of the injection molding machine.

An injection molding machine of the screw inline type (manufactured by Meiki Seisakusho and sold under the tradename of M-32) is used in this Example. As shown in FIG. 2, the cylinder 20 is divided axially and equally into five zones A–E. The zone A of a heating cylinder, most close to a nozzle, is maintained at 75° C. The zone B next to the zone A is maintained at 65° C. and the other zones C, D, and E are maintained at 35° C., respectively. With respect to an injection pressure, the maximum pressure is 200 kg/cm$^2$. The injection pressure is raised upto the maximum pressure by 20 seconds from the start of the injection. Thereafter it is lowered to 50 kg/cm$^2$ and is maintained for 5 seconds, and then gate cut pins are operated to shut off the gates. The time period from the closing of the mold to the opening of the mold is 60 seconds, and the total molding cycle is 80 seconds. The temperature of the mold is set to 175° C.

The mold is a twenty-cavity mold. Two lead frames each having 10 IC elements (16p DIP) disposed sequentially, bonded thereto and wire-bonded thereto by gold wires are automatically set in the mold, and the molding is carried out continuously. The appearance, filling ability, wire sweep, and surface hardness of the resin-encapsulated semiconductor devices are measured every hour. Results are shown in Table 2.

TABLE 2

|  | Appearance | Filling ability | Wire sweep | Surface hardness |
|---|---|---|---|---|
| Initial stage | good | good | not more than 5% | 74 |
| 5 hours past | " | " | not more than 5% | 75 |
| 10 hours past | " | " | not more than 5% | 74 |
| 15 hours past | " | " | not more than 5% | 75 |
| 20 hours past | " | " | not more than 5% | 76 |

Measurement (1) Appearance; Filling ability: These are judged with the visual inspection, and particularly the appearance is checked with respect to whether or not it has good luster.

(2) Wire sweep: A soft X-ray is applied to the molded product, and the amount of sweep of the bonding wire (semi-hard gold wire having a diameter of 25 μm and a length 3 mm) is measured. The wire sweep is expressed in the term of a ratio of the maximum wire sweep to the distance (500 μm) between the bonding wires.

(3) Surface hardness: The surface hardness of the molded product immediately after the opening of the mold is measured by a Barcol hardness tester (#935).

These results shown in the table 2 are similar to those obtained with the conventional low-pressure transfer molding, and indicate that there is no problem at all. Therefore, it will be appreciated that the long-time, continuous molding can be effected.

A further embodiment of the present invention is characterized in that hoop molding is used.

Figure 5:
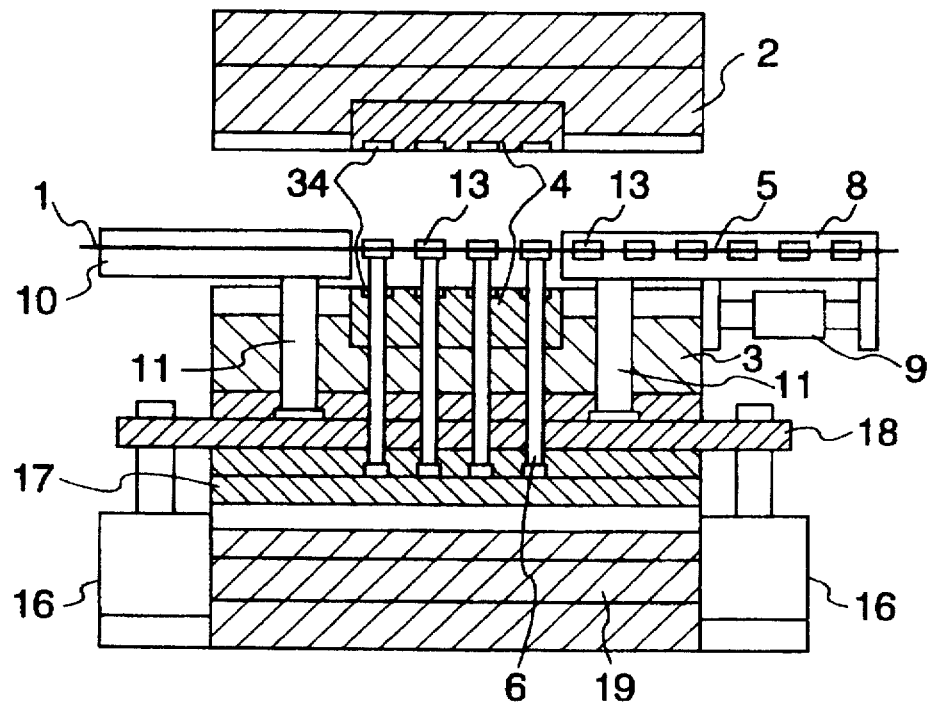
FIG. 5 is a cross-sectional view of the mold, showing a condition in which molded products are ejected and discharged.
Figure 6:
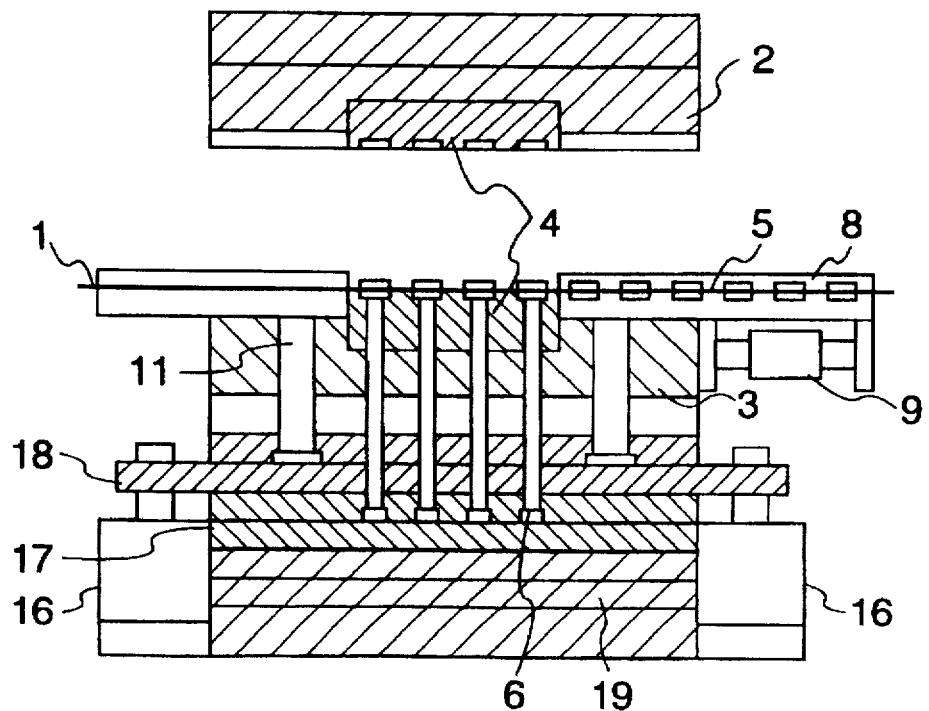
FIG. 6 is a cross-sectional view of the mold, showing the transfer of a lead frame.
Figure 7:
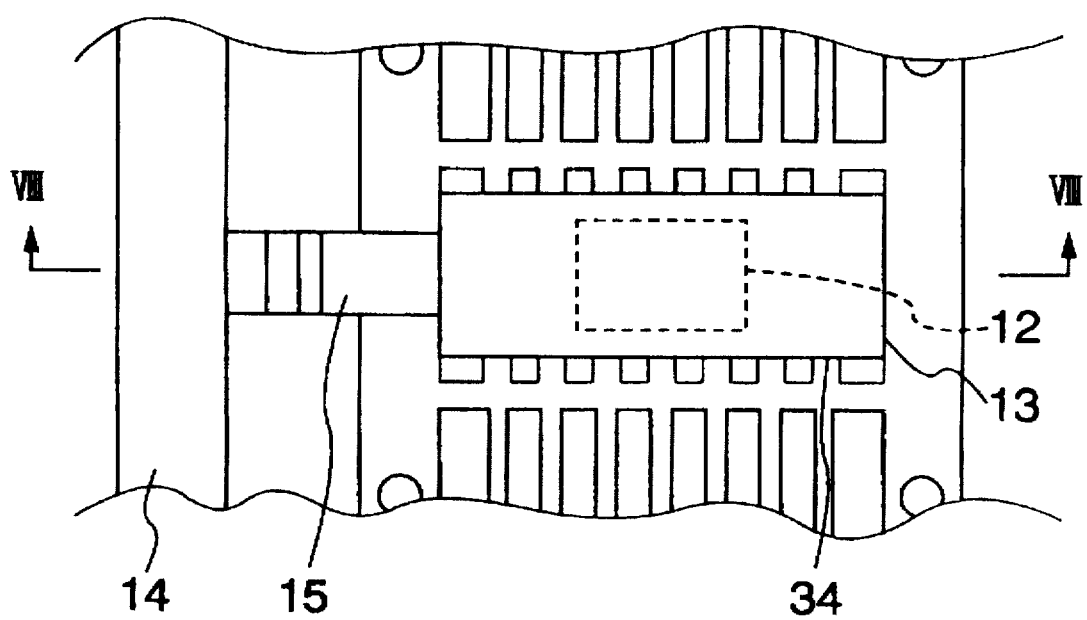
FIG. 7 is an enlarged, plan view showing the arrangement of a runner, gates and cavities in the mold, and showing a condition immediately after a molding compound is filled in the cavities.
Figure 8:
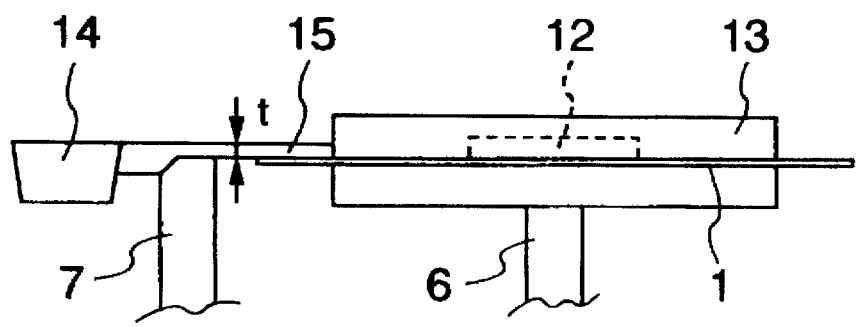
FIG. 8 is a cross-sectional view taken along the line VIII—VIII of FIG. 7.

Referring to FIGS. 3 to 8, a long lead frame 1, having portions on which the semiconductors are to be mounted, is unwound or supplied from a reel (not shown), and semiconductors 12 are bonded to the lead frame 1, and are wire-bonded to the lead frame 1. The lead frame 1 is guided by a feed guide 10 into a mold 4 so that a predetermined length of the lead frame 1 is set in the mold 4. The feed guide 10 is supported by return pins 11. Lower ends of the return pins 11 are supported by a support plate 18 which is moved upward and downward by a drive cylinder 16. The mold 4 comprises an upper mold 2 and a lower mold 3. The upper mold 2 can be moved upward away from the lower mold 3 by drive means (not shown) so that the mold 4 can be opened. Ejector pins 6, well known in the art, extend slidably through the lower mold 3 to cavities 34 in the mold 4. Lower ends of the ejector pins 6 are supported by an ejector pin operating plate 17. The plate 17 is connected to the support plate 18, and is moved upward and downward by the drive cylinder 16. Referring to FIGS. 7 and 8, a molding compound from an injection molding machine is filled in each cavity 34 in the mold 4 through a runner 14 and a gate 15. Gate cut pins 7 are provided for opening and closing the respective gates 15, lower ends of which pins are supported by a pin support plate 19. The pin support plate 19 is moved upward and downward with a distance t (see FIG. 4) by drive means (not shown) so that the gate cut pins 7 can open and close the respective gates 15.

A feed mechanism 9 for moving another feed guide 8 in a right-hand direction (FIG. 3) is provided between the lower mold 3 and the feed guide 8.

Figure 3:
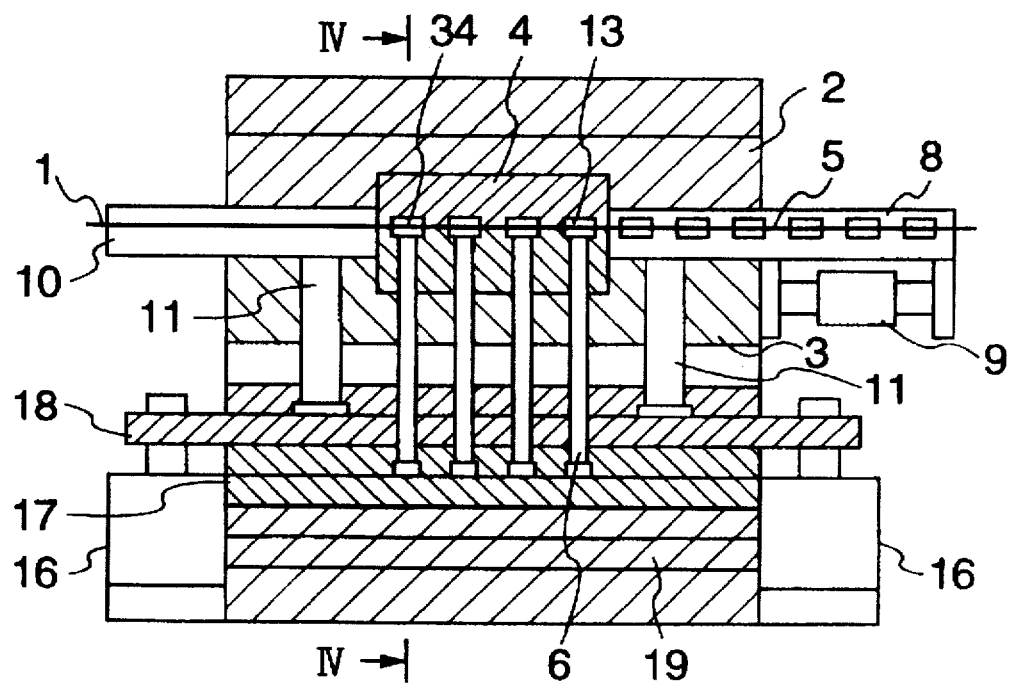
FIG. 3 is a cross-sectional view showing a closed mold and its associated parts in hoop molding.
Figure 4:
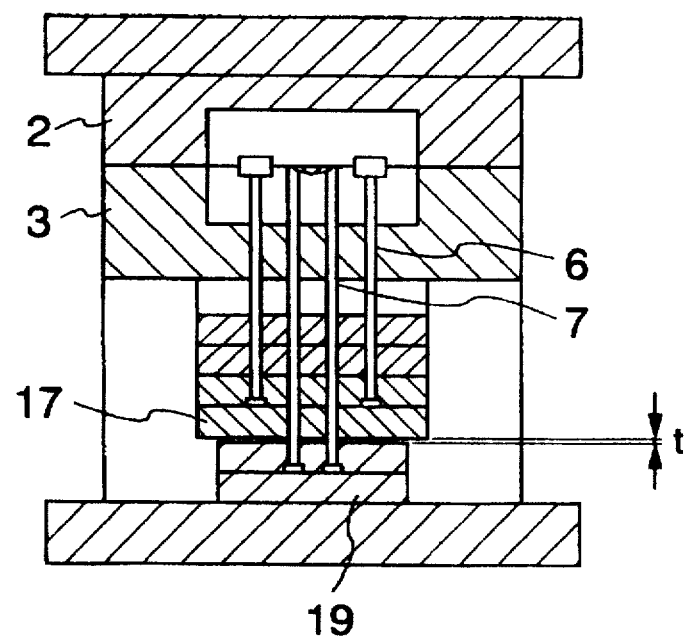
FIG. 4 is a cross-sectional view taken along the line IV—IV of FIG. 3.

In the condition shown in FIG. 3, the molding compound is injected into the cavities 34 in the mold 4, and the gate cut pins 7 are operated to shut off the gates 15, so that each molded product (comprising the semiconductor 12 encapsulated by the resin molding compound 13) is isolated from the runner 14. After the injected material is cured, the upper mold 2 is moved upward to open the mold 4 as shown in FIG. 6. Then, as shown in FIG. 5, the drive cylinder 16 is driven to move the support plate 18 upward. As a result, the feed guides 10 and 8, supported by the return pins 11, are moved upward away from the lower mold 3. The ejector pin operating plate 17 is also moved upward, so that the ejector pins 6 eject the respective molded products from the respective cavities 34 in the lower mold 3. They are discharged from the lower mold 3. Then, the feed mechanism 9 is operated to move the feed guide 8 in the right-hand direction, thereby moving a molded lead frame portion 5 by a predetermined distance in the right-hand direction.

Usually, the separation of the molded lead frame portion 5 and the bending of leads of the frame portion 5 are effected at the same time. Flashes formed on the periphery of each molded product are easily removed since such flashes are usually very thin.

As shown in FIG. 6, after the feed guide 8 is returned to its initial position by the feed mechanism 9, the drive cylinder 16 is operated to move the return pins 11 and the ejector pins 6 downward. The lead frame 1 is again set in the lower mold 3, and then the upper mold 2 is moved downward to close the mold 4. The above-mentioned molding is repeated on a non-molded portion of the lead frame 1 subsequent to the precedingly-molded lead frame portion 5.

FIGS. 7 and 8 are enlarged views showing the runner, the gate and the cavity in the mold, and show a condition immediately after the molding compound 13 is filled in the cavity 34. The injected molding compound is filled in the respective cavities 34 through the sprue (not shown), the runner 14 and the gate 15. The lead frame 1, each having the semiconductor 12 bonded thereto, have been set again in the cavities 34, respectively. Then, each gate cut pin 7 is moved upward by a distance corresponding to the height t of the gate, thereby shutting off the gate 15. After the molding compound is cured, the mold is opened, and the molded products are ejected. The molding compound cured in the runner 14 is isolated from the molded lead frame portion 5. Therefore the molded lead frame portion 5 is smoothly transferred by the feed mechanism 9, so that the subsequent molding operation can be carried out. In case of no gate cut pins 7, it is necessary to cut off the gate by some means after the product is ejected, or it is necessary that the gate be formed into such a shape as that of a pin point gate or a film gate so that it can be spontaneously cut off easily.

In this embodiment of the invention, the hoop molding is used, and therefore the sequential molding process can be automatically effected in an unmanned manner, which process includes the steps of unwinding of the lead frame, bonding of the semiconductors, wire bonding, setting of the lead frame in the mold, molding, removing the molded products, separating the molded products from the lead frame, and bending of the leads of the molded products Therefore, the sequential steps from the unwinding of the lead frame to the post-processing of the molded product can be carried out in one system.

EXAMPLE 3

An epoxy resin molding compound, used here, comprises, as main components, an orthocresol novolak-type epoxy resin (epoxy resin equivalent weight 200), phenolic novolak (hydroxyl group equivalent weight 103), diazabicycloundecenes (curing accelerator), and molten silica, and further a mold release agent, a pigment and so on.

An injection molding machine of the screw inline type (manufactured by Meiki Seisakusho and sold under the tradename of M-32) is used in this Example. As shown in FIG. 2, the cylinder 20 is divided axially and equally into five zones A–E. The zone A of a heating cylinder, most close to a nozzle, is maintained at 75° C. The zone B next to the zone A is maintained at 65° C. and the other zones C, D, and E are maintained at 35° C., respectively. With respect to an injection pressure, the maximum pressure is 200 kg/cm². The injection pressure is raised upto the maximum pressure by 20 seconds from the start of the injection. Thereafter it is lowered to 50 kg/cm² and is maintained for 5 seconds, and then gate cut pins are operated to shut off the gates. The time period from the closing of the mold to the opening of the mold is 60 seconds, and the total molding cycle is 80 seconds. The temperature of the mold is set to 175° C. A mold had two rows of cavities, each rowing having 10 cavities, and therefore the mold is a twenty-cavity mold.

Long lead frames are unwound or supplied respectively from reels. IC elements (16p DIP) are bonded to each of these lead frames, and wire-bonded thereto by gold wires. These two lead frames are fed to the above mold, and the molding is automatically effected continuously at a molding cycle of 120 seconds. A molded frame portion of each lead frame is separated, and leads are bent, and at the same time flashes around the periphery of each molded product are removed. These flashes are very thin, and therefore they be removed simultaneously with the separation of the frame portion and the bending of the leads. The appearance, filling ability, wire sweep, surface hardness of the molded products are measured every hour. Results, obtained every five hours, are shown in Table 3.

TABLE 3

| | Appearance | Filling ability | Wire sweep | Surface hardness |
|---|---|---|---|---|
| Initial stage | good | good | not more than 5% | 74 |
| 5 hours past | " | " | not more than 5% | 75 |
| 10 hours past | " | " | not more than 5% | 74 |
| 15 hours past | " | " | not more than 5% | 75 |
| 20 hours past | " | " | not more than 5% | 76 |

Measurement (1) Appearance; Filling ability: These are judged with the visual inspection, and particularly the appearance is checked with respect to whether or not it has good luster.

(2) Wire sweep: A soft X-ray is applied to the molded product, and the amount of sweep of the bonding wires (semi-hard gold wire having a diameter of 25 μm and a length 3 mm) is measured. The wire sweep is expressed in the term of a ratio of the maximum wire sweep to the distance (500 μm) between the bonding wires.

(3) Surface hardness: The surface hardness of the molded product immediately after the opening of the mold is measured by a Barcol hardness tester (#935).

These results shown in the table 3 are similar to those obtained with the conventional low-pressure transfer molding, and indicate that there is no problem at all. Therefore, it will be appreciated that the long-time, continuous molding can be effected.

In this embodiment of the invention, it has become clear that the encapsulation of the semiconductors by the epoxy resin molding compound can be effected continuously for a long time period by the injection molding of the hoop molding without any problem. In this embodiment of the invention, the hoop molding is used, and therefore the sequential molding process can be automatically effected in an unmanned manner, which process includes the steps of unwinding of the lead frame, bonding of the semiconductors thereon, wire bonding, setting of the lead frame in the mold, molding, removing the molded products, and postworking of the molded products.

A further embodiment of the present invention is characterized in that a rotary molding method is used.

Figure 9:
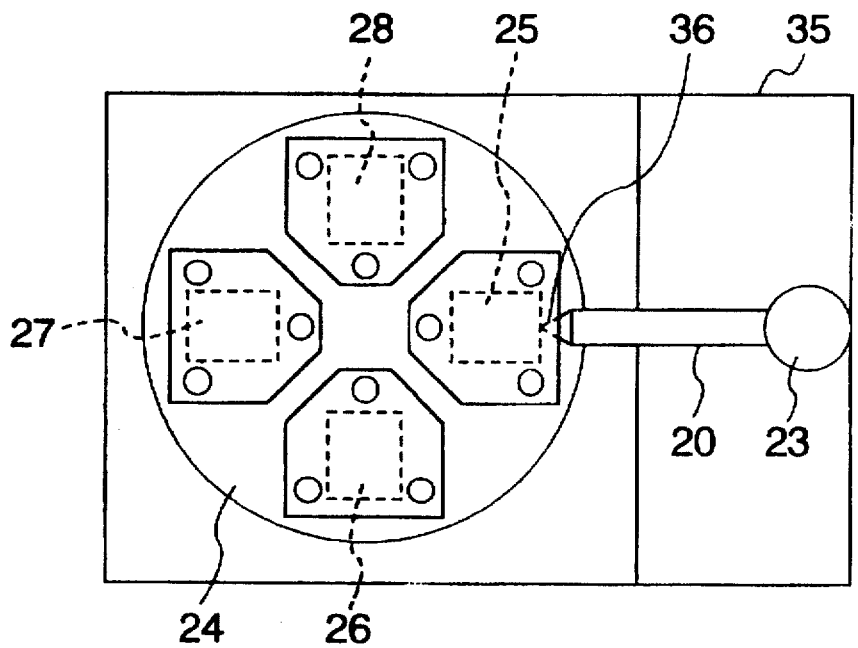
FIG. 9 is a schematic plan view of a rotary injection molding apparatus.
Figure 10:
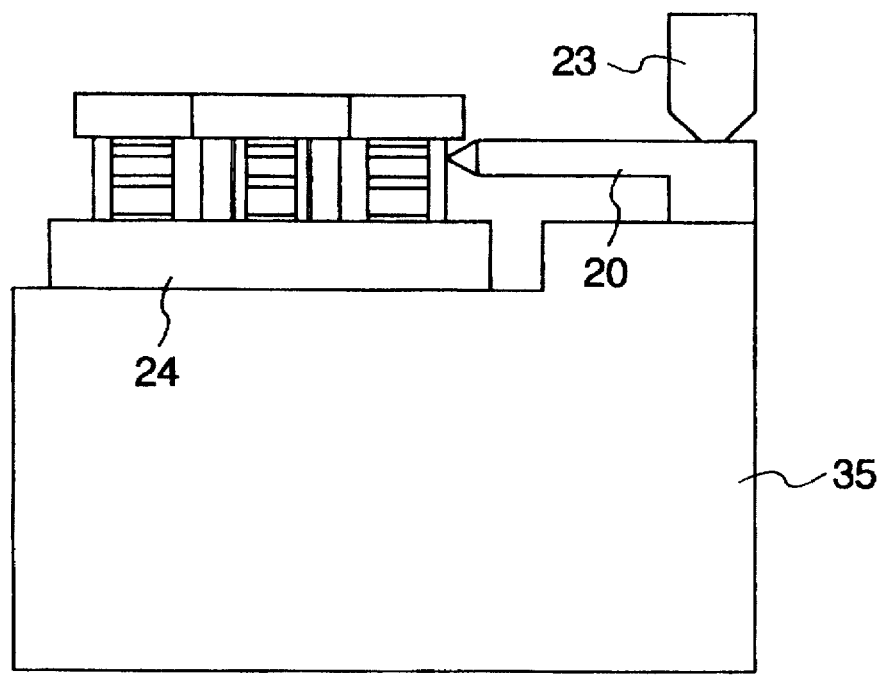
FIG. 10 is a schematic side-elevational view of the rotary injection molding apparatus.
Figure 11:
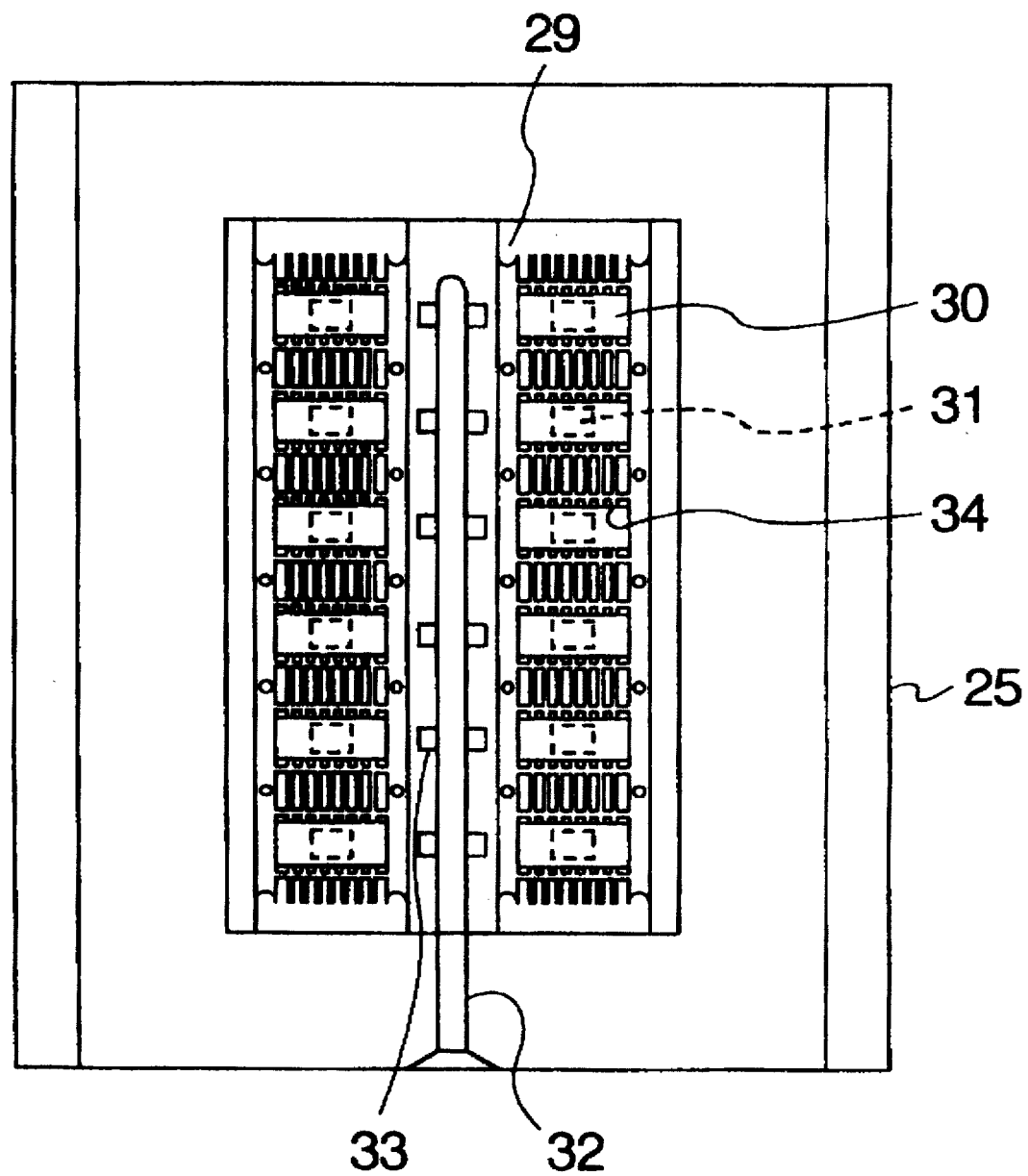
FIG. 11 is a plan view of a lower mold of a mold device, showing a condition in which lead frames are set in the mold device, and a molding compound is filled in the cavity of the mold device.

Referring to FIGS. 9 to 11, a rotary injection molding apparatus 35 comprises an injection molding machine 20 having a hopper 23, and a rotary table 24 provided in generally juxtaposed relation to the injection molding machine 20. Four mold devices 25, 26, 27 and 28 are mounted on the rotary table 24, and are circumferentially spaced by 90° from one another. In FIG. 9, a nozzle 36 of the injection molding machine 20 communicates with a sprue-runner 32 (see FIG. 11) of the mold device 25, and a molding compound is filled in the mold device 25. Thus, the molding compound is filled in the mold device 25, and is held at a predetermined pressure, and at the same time the curing of the molding compound proceeds in the mold devices 26 and 27 where the mold is closed or clamped. In the mold device 28, the mold is opened to remove the molded products (each comprising a semiconductor element 31 encapsulated by the molding compound 30), and lead frames 29 are set in the mold and the mold is closed.

When each of the four mold devices is return back to the original position, one molding cycle for such mold device is completed. Therefore, if the molding cycle of each mold device is 120 seconds, the molding is effected at a cycle of 30 seconds since this rotary injection molding apparatus 35 has the four stages, and therefore the overall molding cycle can be greatly reduced.

Particularly, a certain time period is necessary for the epoxy resin molding compound to be cured by heating, and it is difficult to reduce the time period from the injecting start to the mold opening. In this embodiment of the invention, the rotary molding is used, and therefore this time period can be greatly reduced. Therefore, the molding cycle can be greatly reduced.

Further, gate cut pins 33 are provided in each mold, and after the molding compound is injected and filled in the mold, the gate cut pins 33 are operated to shut off the gates so as to isolate the molded products from the sprue-runner 32, thereby facilitating the removal of the molded product and the post-processing. Usually, the separation of the molded products from the lead frame and the bending of leads of the molded products are effected at the same time. At this time, flashes formed on the periphery of each molded product are easily removed since such burrs are usually very thin.

It is possible to encapsulate a plurality of kinds of semiconductors simultaneously by means of varying the cavity shape of the mold devices and/or the configuration of the lead frames. If the removal of the molded products and the setting of the lead frames are effected automatically by a robot, the continuous molding can be effected without manual operations, and different kinds of molded products can be easily assorted without mistake.

In this embodiment of the invention, if the separation of the molded products from the lead frame and post-processing of the molded products after the removal of the molded product from the mold are effected in continuous relation to the molding operation, the sequential steps from the setting of the lead frame in the mold to the post-processing of the molded product can be carried out in one system.

EXAMPLE 4

An epoxy resin molding compound used here comprises, as main components, an orthocresol novolaktype epoxy resin (epoxy resin equivalent weight 200), phenolic novolak (hydroxyl group equivalent weight 103), a diazabicycloundecenes (curing accelerator), and molten silica, and further a mold release agent, a pigment and so on.

An injection molding machine of the screw inline type (manufactured by Meiki Seisakusho and sold under the tradename of M-32) is used in this Example. As shown in FIG. 2, the cylinder 20 is divided axially and equally into five zones A–E. The zone A of a heating cylinder, most close to a nozzle, is maintained at 75° C. The zone B next to the zone A is maintained at 65° C. and the other zones C, D, and E are maintained at 35° C., respectively. With respect to an injection pressure, the maximum pressure is 200 kg/cm². The injection pressure is raised upto the maximum pressure by 20 seconds from the start of the injection. Thereafter it is lowered to 50 kg/cm² and is maintained for 5 seconds, and then gate cut pins are operated to shut off the gates. The time period from the closing of the mold to the opening of the mold is 60 seconds, and the total molding cycle is 80 seconds.

Each of mold devices has two rows of cavities, each rowing having 10 cavities, and therefore the mold device is a twenty-cavity mold. Two lead frames each having IC elements (16p DIP) bonded thereto and wire-bonded thereto by gold wires, are set in the mold device, A mold temperature is set to 175° C.

The four mold devices are mounted on a rotary table, and circumferentially spaced 90° from one another.

The molding operation is carried out as described above with reference to FIG. 9, and the time required for one revolution of the rotary table is 120 seconds, and the time of stop of each mold device at each stage is 30 seconds. Under these conditions, the continuous molding is effected. The setting of the lead frames and the removal of the molded products are effected both by manual operations and by a robot. In both cases, these operations can be effected without any problem. A molded products are separated from each lead frame, and the leads are bent. Simultaneously, the flashes around the periphery of each molded product are removed. These flashes are very thin, and therefore can be removed simultaneously with the separation of the frame portion and the bending of the leads. The appearance, filling ability, wire sweep, surface hardness of the encapsulated products are measured every hour. Results, obtained every five hours, are shown in Table 4.

TABLE 4

|  | Appearance | Filling ability | Wire sweep | Surface hardness |
| --- | --- | --- | --- | --- |
| Initial stage | good | good | not more than 5% | 76 |
| 5 hours past | " | " | not more than 5% | 76 |
| 10 hours past | " | " | not more than 5% | 75 |
| 15 hours past | " | " | not more than 5% | 75 |
| 20 hours past | " | " | not more than 5% | 77 |

Measurement (1) Appearance; Filling ability: These are judged with the visual inspection, and particularly the appearance is checked with respect to whether or not it has good luster.

(2) Wire sweep: A soft X-ray is applied to the molded product, and the amount of sweep of the bonding wires (semi-hard gold wire having a diameter of 25 μm and a length 3 mm) is measured. The wire sweep is expressed in the term of a ratio of the maximum wire sweep to the distance (500 μm) between the bonding wires.

(3) Surface hardness: The surface hardness of the molded product immediately after the opening of the mold is measured by a Barcol hardness tester (#935).

These results are similar to those obtained with the conventional low-pressure transfer molding, and indicate that there is no problem at all. Therefore, the automatic, continuous molding, including the sequential processing steps from the setting of the lead frames in the mold to the post-processing of the molded products, can be effected for a long period of time.

According to the invention, the encapsulation of the semiconductors by the epoxy resin molding compound can be effected continuously for a long time period by the injection molding of the rotary molding type without any problem. By effecting the setting of the lead frames, the removal of the molded products, the post-processing of the molded products and so on automatically or by a robot, the molding operation can be completely automated.

The molding compound in the form of powder or granules can be supplied to the injection molding machine, and therefore does not need to be preformed into a tablet-like shape as in the transfer molding. Therefore, vase apparatus and time required for the tableting are omitted. Since the pre-processing such as the tableting is unnecessary, there is little possibility that impurities are included into the molding compound. Sprueless molding and sprue-runnerless molding can be adopted, and therefore the ratio of the cured material (waste) other than the molded products is greatly reduced.

What is claimed is:

1. A method of producing a resin-encapsulated semiconductor device by injecting an epoxy resin molding compound into an injection mold, in which a lead frame, to which a semiconductor has been bonded and wire-bonded, is fixedly set as an insert in the injection mold, and by curing such epoxy resin molding compound in said injection mold, the method comprising the steps of:

injecting epoxy resin molding compound into said injection mold;

gradually increasing an injection pressure of said injection molding machine in such a manner that a maximum pressure of 30 kg/cm$^2$ to 300 kg/cm$^2$ is achieved at the time when 80% to 95% of a total amount of the epoxy resin molding compound to be injected is injected into the injection mold; and injecting the remaining epoxy resin molding compound at an injection pressure of 20 kg/cm$^2$ to 100 kg/cm$^2$.

2. A method according to claim 1, wherein filling said molding compound in said mold is stopped by means of shutting off gates through which said molding compound flows in said mold, after said molding compound is filled in said mold and before said mold is opened.

3. A method according to claim 1, further comprising the step of heating a cylinder of said injection molding machine to 65° C.–110° C.

4. A method according to claim 1, further comprising the steps of:

locating a plurality of said semiconductor elements to said lead frame in series, intermittently;

wire-bonding said semiconductor elements to said lead frame;

setting said lead frame as an insert in said mold;

injecting said epoxy resin molding compound into said mold by said injection molding machine;

ejecting the molded lead frame from said mold after curing of said molding compound;

moving said lead frame in a lengthwise direction by a predetermined length, and again setting said lead frame as an insert in said mold; and injecting said epoxy resin molding compound into said mold with respect to a subsequent portion of said lead frame.

5. A method according to claim 1, further comprising the steps:

providing a rotary injection molding apparatus in which a plurality of mold devices are mounted on a rotary table, and are spaced by a predetermined angle from one another;

setting said lead frame, having the semiconductor element bonded thereto and wire-bonded thereto, in each of said mold devices;

injecting said epoxy resin molding compound into one of said mold devices at an injection position by said injecting molding machine;

intermittently rotating said rotary table by said predetermined angle to bring the next mold device to said injection; and removing the resin-encapsulated semiconductor device from said mold device.

6. A method according to claim 1, wherein said epoxy resin molding compound comprises an epoxy resin, a phenolic resin as a cure agent, a curing accelerator, and an inorganic filler.

7. A method for producing a resin-encapsulated semiconductor device by an injection molding machine by means of injecting an .epoxy resin molding compound into an injection mold in which a lead frame having a semiconductor element mounted thereto and wire-bonded thereto is fixedly set as an insert, said injection molding machine including a cylinder provided at one end thereof with a hopper through which the epoxy resin is supplied into the injection molding machine and at the other end thereof with a nozzle, which cylinder is axially divided into a plurality of sections, wherein each of which sections is to be controlled independently in temperature thereof, and one of said sections most close to said nozzle is maintained at 65° C.–110° C. and one of said sections most close to said hopper is maintained at a room temperature –50° C.

8. A method according to claim 7, comprising the steps of:

gradually increasing an injection pressure of said injection molding machine in such a manner that a maximum pressure of 30 kg/cm$^2$ to 300 kg/cm$^2$ is achieved at the time when 80% to 95% of a total amount of the epoxy resin molding compound to be injected is injected into said mold; and injecting the remaining epoxy resin molding compound at an injection pressure of 20 kg/cm$^2$ to 100 kg/cm$^2$.

9. A method according to claim 7 wherein filling said molding compound in said mold is stopped by means of shutting off gates through which said molding compound flows, after said molding compound is filled in said mold and before said mold is opened.

10. A method according to claim 7, further comprising the steps of:

locating a plurality of said semiconductor elements to said lead frame in series, intermittently;

wire-bonding said semiconductor elements to Said lead frame;

setting said lead frame as an insert in said mold;

injecting said epoxy resin molding compound into said mold by said injection molding machine;

ejecting the molded lead frame from said mold after curing of said molding compound;

moving said lead frame in a lengthwise direction by a predetermined length, and again setting said lead frame as an insert in said mold; and injecting said epoxy resin molding compound into said mold with respect to a subsequent portion of said lead frame.

11. A method according to claim 7, further comprising the steps:

providing a rotary injection molding apparatus in which a plurality of mold devices are mounted on a rotary table, and are equiangularly spaced by a predetermined angle from one another;

setting said lead frame, having the semiconductor element mounted thereto and wire-bonded thereto, in each of said mold devices;

injecting said epoxy resin molding compound into one of said mold devices at an injection position by said injecting molding machine;

intermittently rotating said rotary table by said predetermined angle to bring the next mold device to said injection; and removing the resin-encapsulated semiconductor device from said mold device.

12. A method according to claim 7, wherein said epoxy resin molding compound comprises an epoxy resin, a phenolic resin as a cure agent, a curing accelerator, and an inorganic filler.

13. A method according to claim 1, in which said mold is a sprueless mold.

14. A method according to claim 1, in which said mold is sprue-runnerless mold.

15. A method ;according to claim 7, in which said mold is a sprueless mold.

16. A method according to claim 7, in which said mold is a sprue-runnerless mold.

* * * * *